United States Patent
Mohanakrishnaswamy et al.

(10) Patent No.: US 8,853,850 B2
(45) Date of Patent: Oct. 7, 2014

(54) MEMS PACKAGING SCHEME USING DIELECTRIC FENCE

(71) Applicant: STMicroelectronics, Inc., Coppell, TX (US)

(72) Inventors: Venkatesh Mohanakrishnaswamy, Chennai (IN); Loi N. Nguyen, Carrollton, TX (US); Venkata Ramana Yogi Mallela, Lees Summit, MO (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 13/784,533

(22) Filed: Mar. 4, 2013

(65) Prior Publication Data

US 2014/0061824 A1    Mar. 6, 2014

Related U.S. Application Data

(63) Continuation of application No. 12/651,340, filed on Dec. 31, 2009, now Pat. No. 8,405,202.

(60) Provisional application No. 61/142,168, filed on Dec. 31, 2008.

(51) Int. Cl.
*H01L 23/12* (2006.01)
*B81B 3/00* (2006.01)
*B81C 1/00* (2006.01)

(52) U.S. Cl.
CPC ....... *B81B 3/0018* (2013.01); *B81C 2203/0109* (2013.01); *B81B 2207/097* (2013.01); *B81C 1/00261* (2013.01); *B81C 1/00269* (2013.01); *B81B 2207/015* (2013.01); *B81C 2203/019* (2013.01)
USPC .... 257/704; 257/253; 257/254; 257/E21.271; 257/E23.134

(58) Field of Classification Search
USPC .......... 257/704, 254, 253, E21.271, E23.134; 438/763
See application file for complete search history.

(56) References Cited

U.S. PATENT DOCUMENTS

| | | | |
|---|---|---|---|
| 6,289,732 B1 | 9/2001 | Murari et al. | |
| 6,405,592 B1 | 6/2002 | Murari et al. | |
| 7,956,428 B2 | 6/2011 | Yama | |
| 7,994,594 B2 | 8/2011 | Inaba et al. | |
| 2007/0042521 A1* | 2/2007 | Yama | 438/48 |

* cited by examiner

Primary Examiner — Timor Karimy
(74) Attorney, Agent, or Firm — Seed IP Law Group, PLLC

(57) ABSTRACT

A packaging scheme for MEMS device is provided. A method of packaging MEMS device in a semiconductor structure includes forming an insulation fence that surrounds the MEMS device on the semiconductor structure. The method further includes attaching a wafer of dielectric material to the insulation fence. The lid wafer, the insulation fence, and the semiconductor structure enclose the MEMS device.

15 Claims, 15 Drawing Sheets

MEMS PACKAGING SCHEME USING DIELECTRIC FENCE

BACKGROUND

1. Technical Field

The present disclosure generally relates to the field of micro-electromechanical systems (MEMS) and, more particularly, to the packaging of MEMS devices.

2. Description of the Related Art

In general, MEMS devices are miniature electro-mechanical devices of high-level integration for carrying out many different categories of functions. The various functions that can be performed in a MEMS device include sensing for motion, light, sound, radio waves, and so forth. MEMS devices can be made as standalone devices and coupled to a separate chip having circuit thereon, or can include integrated electronics and micromechanical components on a common silicon substrate. The electronic components of a MEMS device are typically fabricated using some of the same processes used for fabrication of semiconductor-based integrated circuits, but on a much larger scale. On the other hand, the micromechanical components of a MEMS are typically fabricated using micromachining processes that, for example, selectively add structural layers or etch away parts of the structure to form the mechanical and electro-mechanical portions of the device.

MEMS devices typically contain delicate moving parts. Some modes of motion to be sensed include, for example, motion that causes touching of electrodes, moving parts with constant contact, moving parts without contact, and deformation. Depending on the mode and the purpose of motion, the packaging requirements of MEMS devices differ. The packaging of a MEMS device typically serves one or more functions, such as: protection of the MEMS device from the environment, provision of mechanical support, interfacing with the environment to be tested (e.g., for sensors and actuators), handling of the MEMS device after fabrication, and routing of electrical interconnections.

Currently, there are a number of issues related to the packaging of MEMS devices. For instance, current passivation techniques for MEMS made by the front-side release micromachining processes require large topographies, making it difficult for passivation. Furthermore, the existing lid approach makes vacuum packaging complicated when there is huge topography in the device. Existing hermetic sealing approaches require additional contact levels defined well outside the MEMS device area in order to maintain vacuum seal for the MEMS device, consuming a lot of area on the die.

BRIEF SUMMARY

In one embodiment, a sealed enclosure is constructed over a micro-electro-mechanical systems ("MEMS") device. The enclosure includes a fence constructed around a perimeter of the MEMS device and a lid disposed on top of the fence to seal the enclosure. The fence is constructed in a trench so as to contain an outer dielectric portion and an inner bond-facilitating portion. The outer dielectric portion of the fence prevents the fence from conducting current between electrodes, contacts, or the like. The inner portion of the fence facilitates an adhesive bond between the fence and the lid placed on the fence.

The lid hermetically seals the MEMS device while providing contact accesses to the top side of the MEMS components. In one embodiment of the invention, access openings are partially etched before bonding the wafer lid to the fence and the wafer lid is lapped back to expose the access openings to the MEMS device after bonding. In another embodiment, the access openings are completely etched prior to bonding. In another embodiment, the access openings are etched post bonding. The access openings are outside the perimeter of the sealed enclosure but are close enough to the enclosure to provide direct access to various electrodes of the MEMS device directly below it. Accordingly, the MEMS device is released prior to bonding the wafer lid to the fence of the enclosure.

Figure 1:
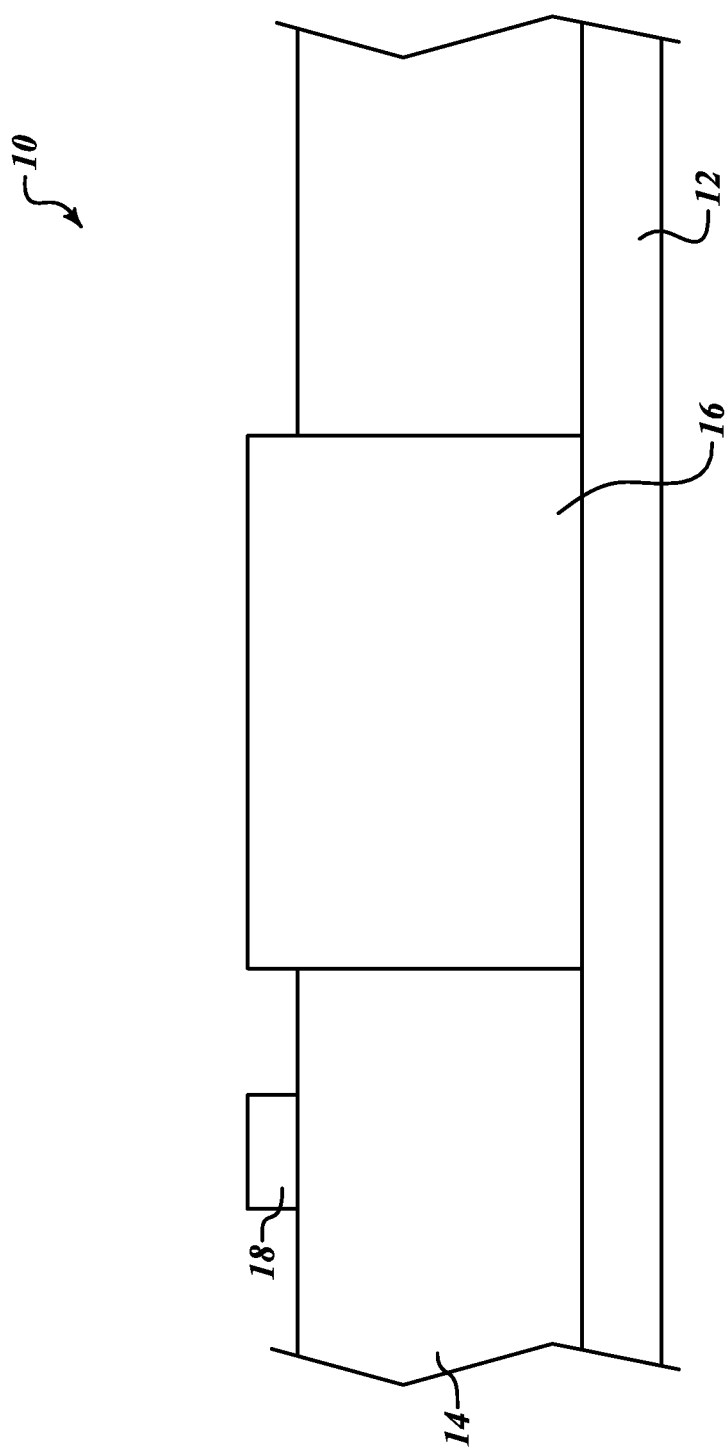
FIG. 1 is a simplified schematic of a semiconductor-based device having a semiconductor structure that includes a MEMS device formed on a substrate.

In the drawings, identical reference numbers identify similar elements or acts. The sizes and relative positions of elements in the drawings are not necessarily drawn to scale. For example, the shapes of various elements and angles, and some of the elements are enlarged and positioned to improve understanding of the inventive features.

DETAILED DESCRIPTION

In the description provided herewith, certain specific details are set forth in order to provide a thorough understanding of various disclosed embodiments. However, one skilled in the relevant art will recognize that embodiments may be practiced without one or more of these specific details, or with other methods, components, etc. In some instances, well-known structures or processes associated with fabrication of MEMS have not been shown or described in detail to avoid unnecessarily obscuring descriptions of the inventive embodiments.

Unless the context requires otherwise, throughout the specification and claims that follow, the words "comprise" and "include" and variations thereof, such as "comprises," "comprising," and "including," are to be construed in an open, inclusive sense, that is, as meaning "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

As used in the specification and appended claims, the use of "correspond," "corresponds," and "corresponding" is intended to describe a ratio of or a similarity between referenced objects. The use of "correspond" or one of its forms should not be construed to mean the exact shape or size.

FIG. 1 illustrates a semiconductor-based device 10 having a semiconductor integrated circuit 14 that is formed on a substrate 12 and includes a MEMS device 16. The substrate 12 is a silicon wafer. The structure 18 is a topology structure that may be part of an adjacent device or that may be part of a MEMS device 16. In one embodiment, structure 18 is an oxide structure. In another embodiment, it is a conductive polysilicon interconnect between the MEMS and the integrated circuit 14. The semiconductor integrated circuit 14 may include any combination of CMOS transistors, bipolar transistors, and the respective layers of semiconductor material, one or more layers of dielectric material, and/or one or more layers of electrically conductive material used to form such structures and interconnect them. Likewise, the MEMS device 16 may include a structure having any combination of semiconductor material, dielectric material, and/or electrically conductive material. The general structure and fabrication process for MEMS devices and semiconductor structures that include MEMS devices are well known in the art. Therefore, detailed structures of the semiconductor structure 14 and the MEMS device 16 are not shown in FIGS. 1-9 to avoid obscuring illustration of some of the inventive features.

Figure 2:
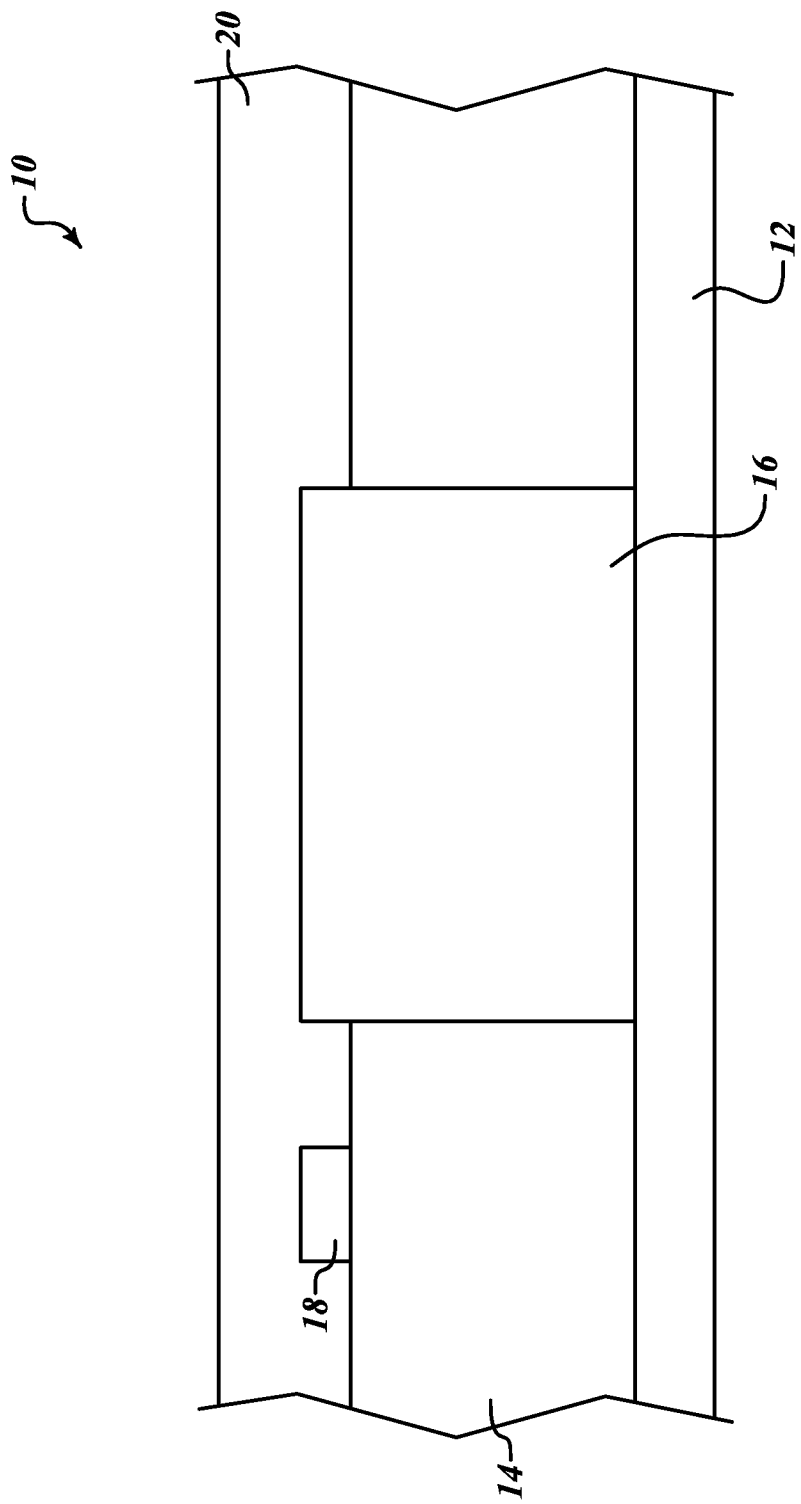
FIGS. 2-8 are simplified schematics progressively showing a fabrication process performed on semiconductor-based device of FIG. 1 to provide packaging for the MEMS device according to an embodiment of the invention.

FIG. 2 illustrates a fabrication process performed on the semiconductor-based device 10 of FIG. 1 according to one embodiment. An oxide layer 20 is formed on the MEMS device 16 and the semiconductor structure 14. In one embodiment, the oxide layer 20 is a layer of tetraethyl orthosilicate (TEOS) deposited on the MEMS device 16 and the semiconductor structure 14. In another embodiment, the oxide layer 20 is a layer of undoped silicate glass (USG) deposited on the MEMS device 16 and the semiconductor structure 14. The oxide layer 20 is planarized after deposition on the MEMS device 16 and the semiconductor structure 14. In one embodiment, the oxide layer 20 is planarized by chemical-mechanical polishing (CMP).

Figure 3:
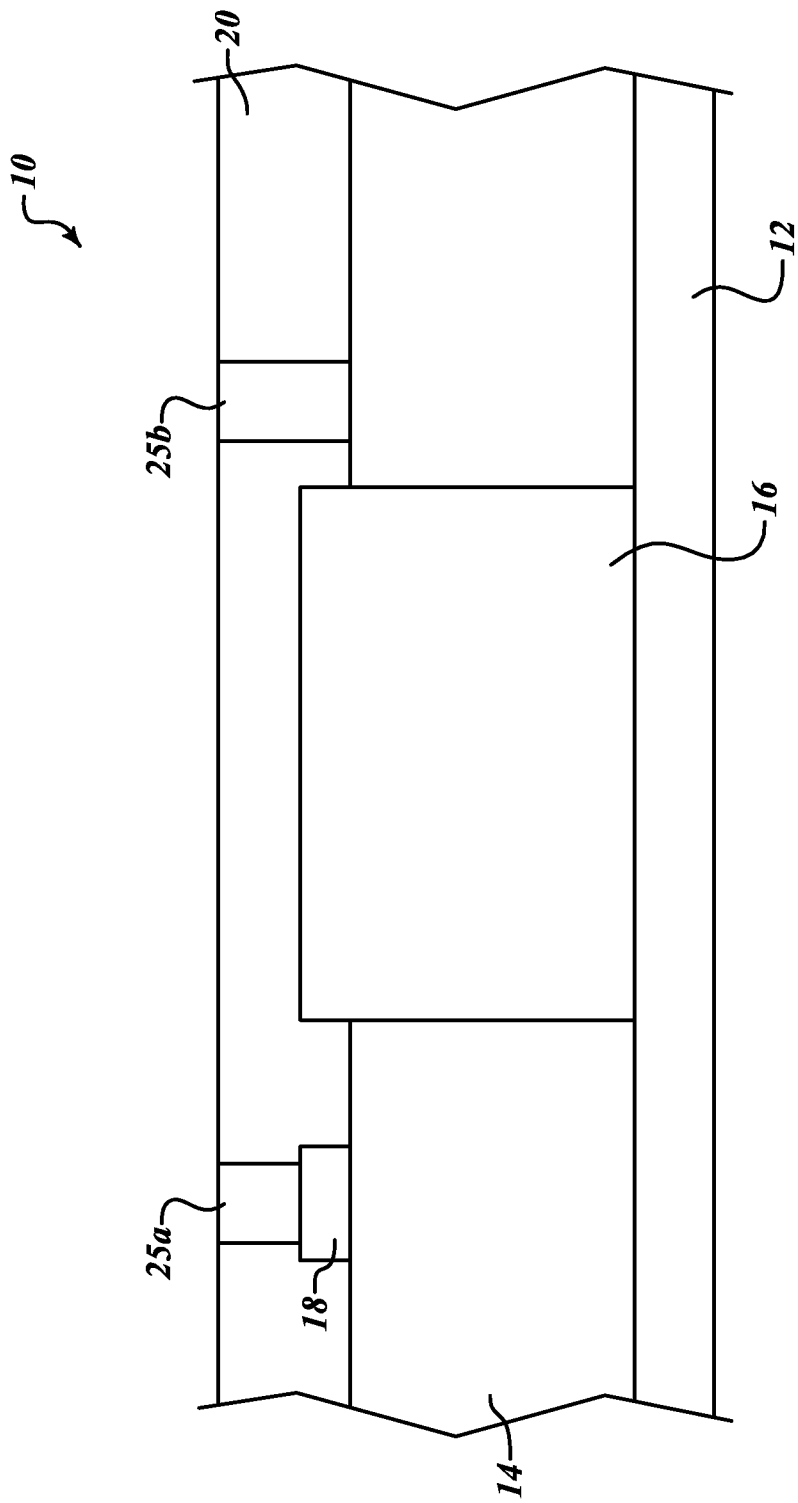

FIG. 3 illustrates a fabrication process performed on the semiconductor-based device 10 of FIG. 2 according to one embodiment. One or more openings, such as 25a and 25b, are formed in the oxide layer 20. In one embodiment, the openings 25a and 25b are formed by lithography and etching. In one embodiment, the oxide layer 20 is etched by dry etching to form the openings 25a and 25b. Although two openings 25a and 25b illustrated in FIG. 3 are examples of where the openings may be formed, the number of openings may be formed in the oxide layer 20 at different locations in various other embodiments. The locations of the openings 25a and 25b are chosen so as to allow the MEMS device 16 to be sealed by a fence structure at different possible boundary locations. A fence will be formed by materials deposited in the openings 25a and 25b, as described in detail below. In one embodiment, the openings 25a and 25b surround an area of the oxide layer 20 that is directly above the MEMS device 16. In one embodiment, the openings 25a and 25b constitute a continuous trench that surrounds an area of the oxide layer 20 that is directly above the MEMS device 16.

Figure 4:
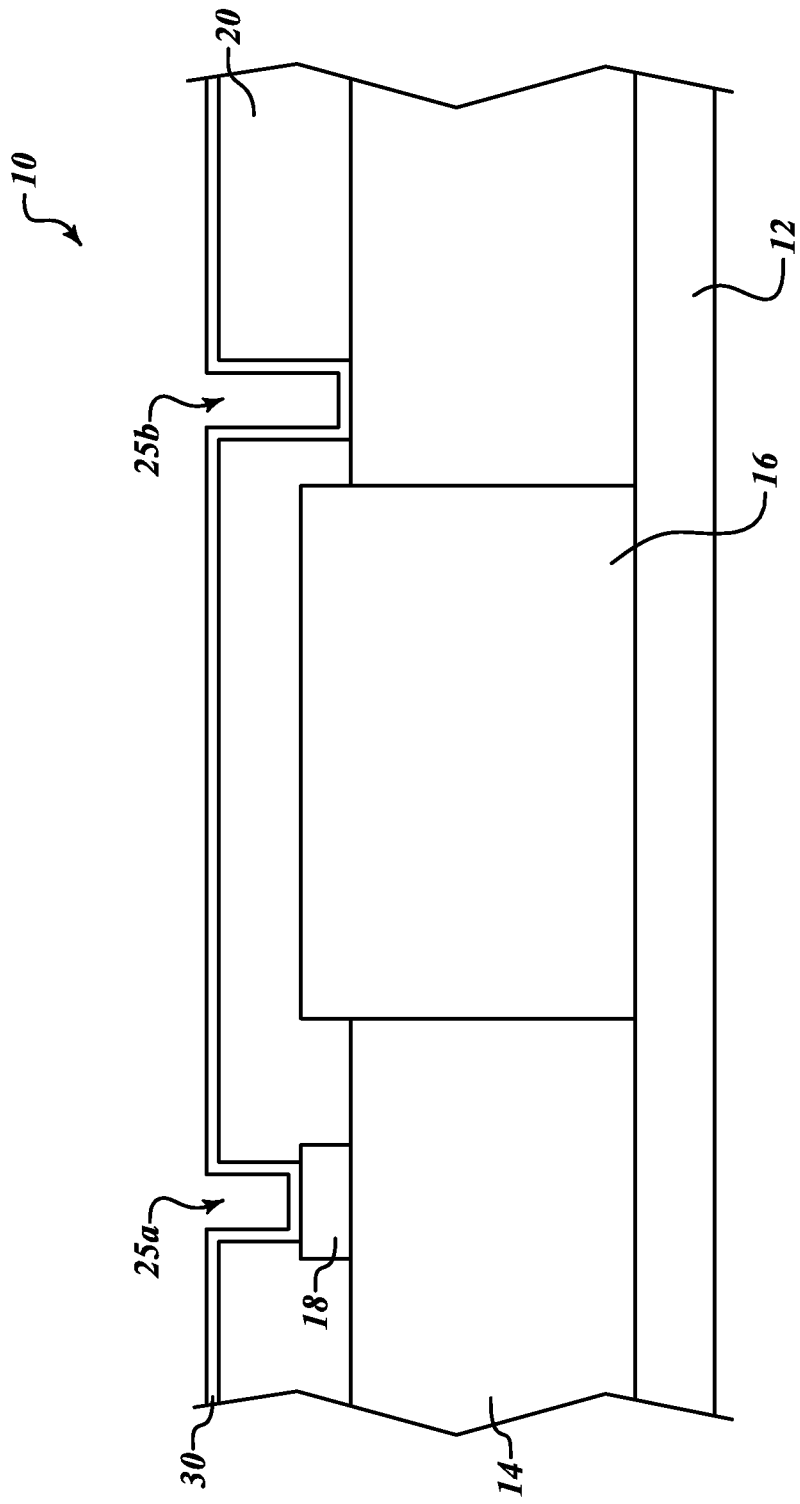

FIG. 4 illustrates a fabrication process performed on the semiconductor-based device 10 of FIG. 3 according to one embodiment. A layer of dielectric material 30 is formed on the oxide layer 20 and in the openings 25a and 25b of the oxide layer 20. Accordingly, the layer of dielectric material 30 is also deposited on the semiconductor structure 14 and the structure 18 in the openings 25a and 25b of the oxide layer 20 where portions of the oxide layer 20 have been etched away.

Figure 7:
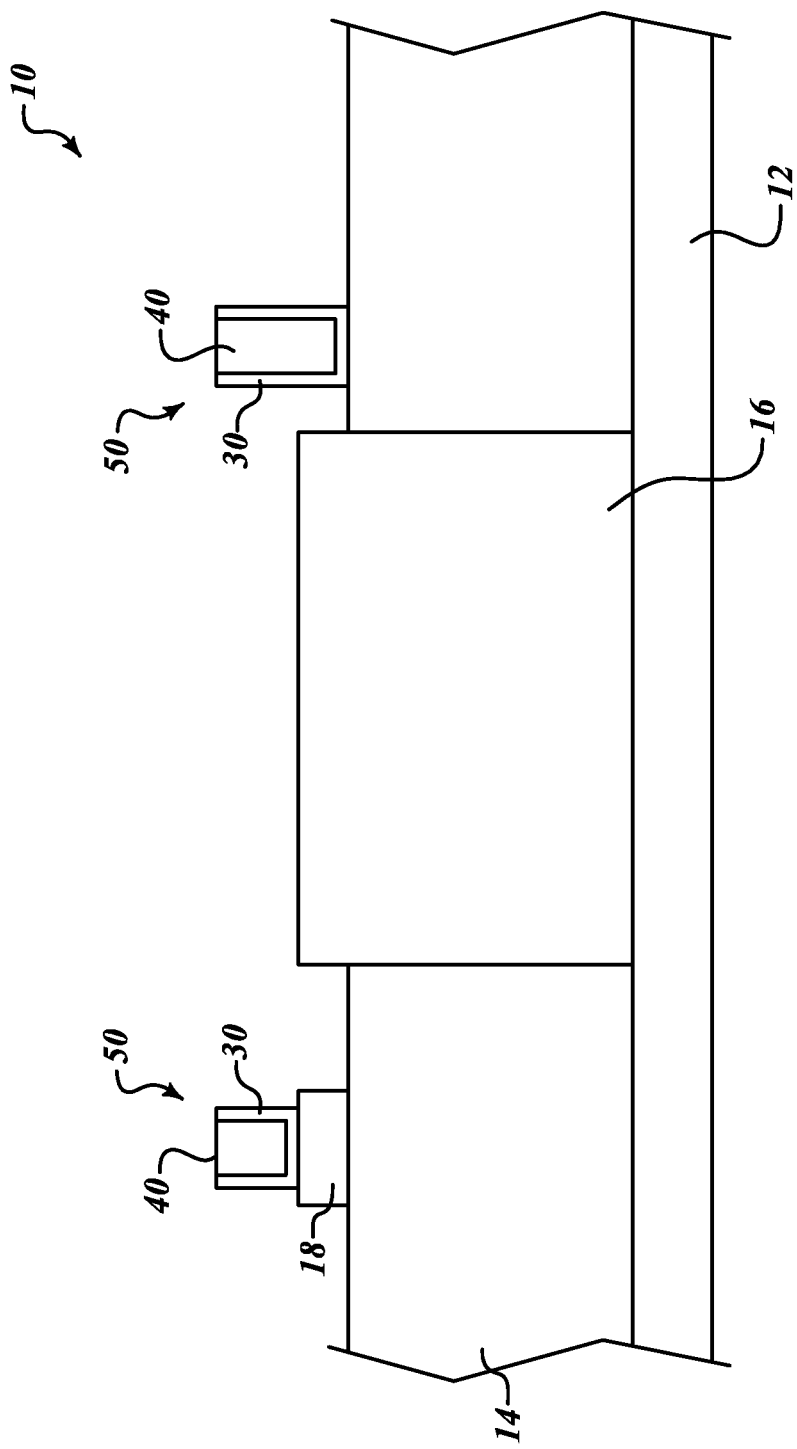

The layer of dielectric material 30 that is deposited in the openings 25a and 25b will eventually form the outer surface of the insulation fence 50, as will be shown in FIG. 7. In one embodiment, the layer of dielectric material 30 is a layer of nitride deposited on the oxide layer 20 and in the openings 25a and 25b of the oxide layer 20. Examples of nitrides that are insulators include silicon nitride and boron nitride. In one embodiment, the layer of dielectric material 30 is a layer of silicon nitride deposited on the oxide layer 20 and in the openings 25a and 25b of the oxide layer 20. Silicon nitride is a hard, solid substance having good shock resistance and other mechanical and thermal properties, and thus is believed to be a suitable material to form the dielectric layer 30. The dielectric layer 30 prevents the fence from conducting current between structures of the semiconductor-based device 10. In one embodiment, the thickness of the layer of dielectric material 30 is approximately 0.5 µm.

Figure 5:
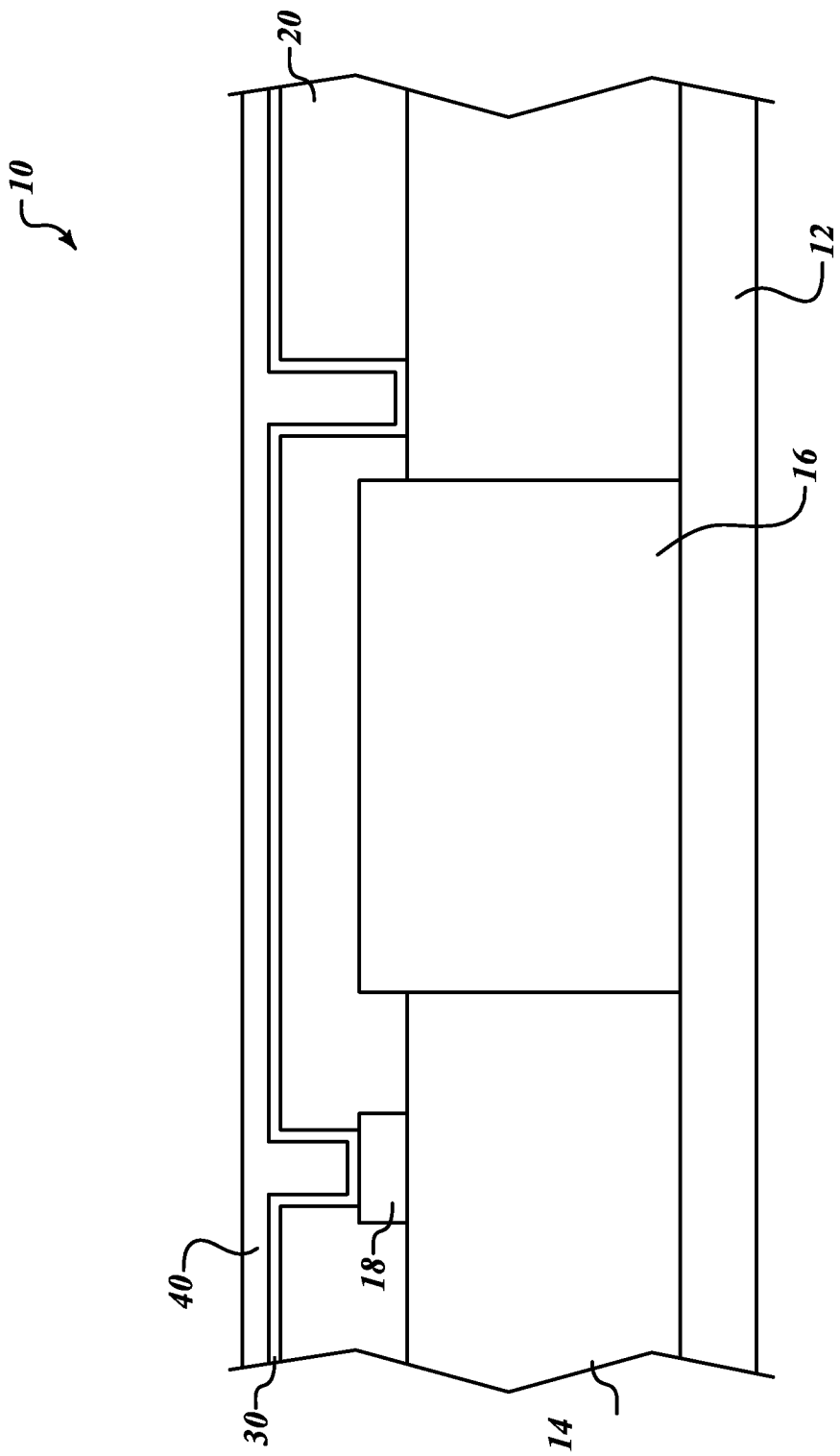

FIG. 5 illustrates a fabrication process performed on the semiconductor-based device 10 of FIG. 4 according to one embodiment. A layer of conductive material 40 is formed on the layer of dielectric material 30. The layer of conductive material 40 also fills the openings 25a and 25b of the oxide layer 20. The layer of conductive material 40 and the layer of dielectric material 30 together form the insulation fence 50, see FIG. 7, to which a lid 60 will be bonded to form packaging for the MEMS device 16.

In one embodiment, the layer of conductive material 40 is a layer of polycrystalline silicon deposited on the layer of dielectric material 30 and in the openings 25a and 25b of the oxide layer 20. In another embodiment, the layer of conductive material 40 is a layer of epitaxially-grown monocrystalline silicon. In yet another embodiment, the layer of conductive material 40 is a layer of metallic material. Because bonding with dielectric material is relatively more difficult, the use of polycrystalline silicon, metal, or epitaxially-grown monocrystalline silicon as a component of the insulation fence 50 will promote bonding between the insulation fence 50 and the lid 60. In one embodiment, the thickness of the layer of conductive material 40 deposited on top of the layer of dielectric material 30 is approximately between 10 and 20 µm.

In one alternative embodiment, the material 40 is a dielectric, such as an oxide or a nitride. The entire openings 25a and 25b are filled completely with an insulator, such as a nitride or an oxide or laminated layers of these two materials.

Figure 6:
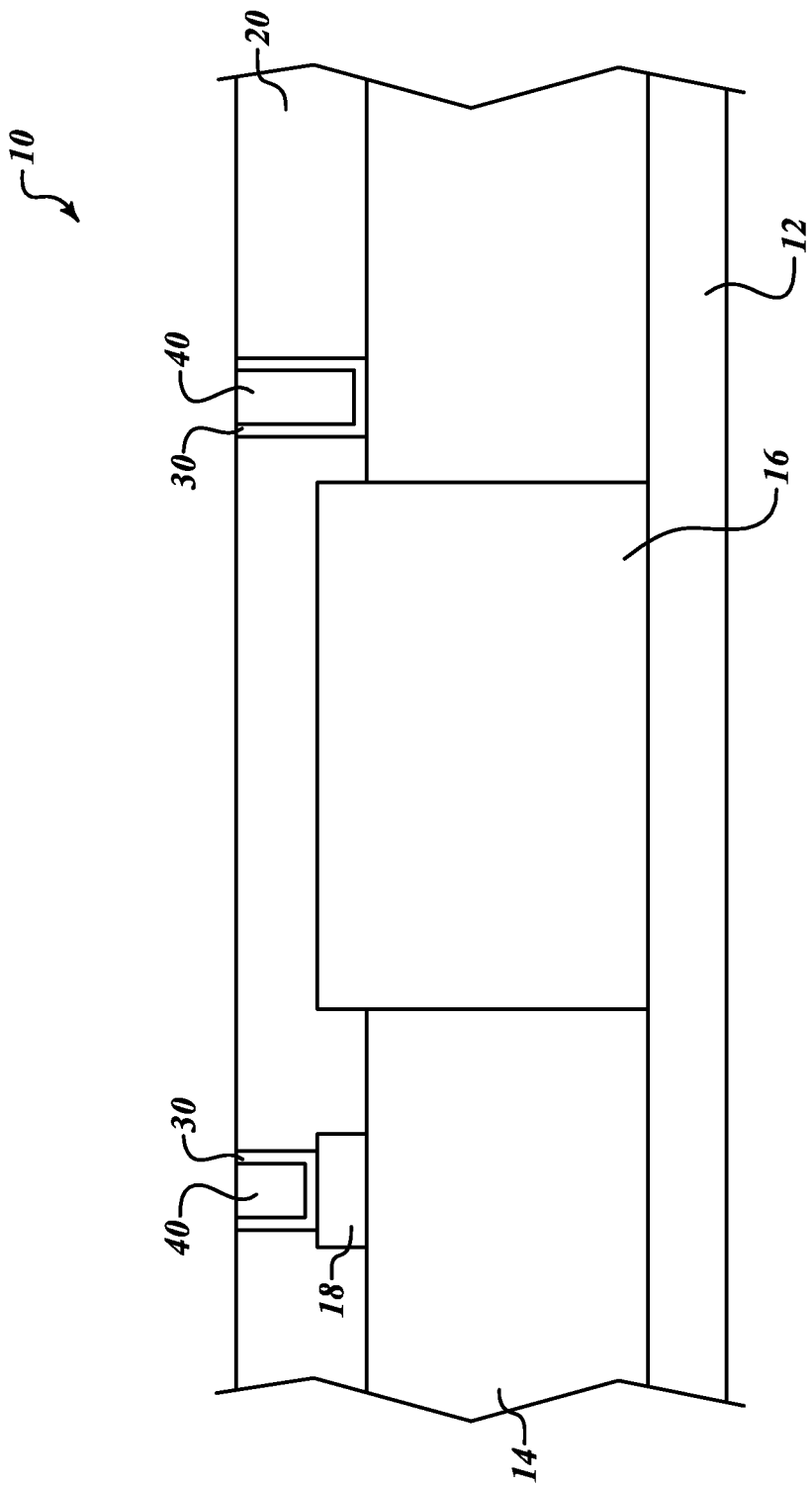

FIG. 6 illustrates a fabrication process performed on the semiconductor-based device 10 of FIG. 5 according to one embodiment. The portions of the layer of conductive material 40 and the layer of dielectric material 30 that are deposited on top of the oxide layer 20 are removed. In one embodiment, the layer of conductive material 40 and the layer of dielectric material 30 are etched back by CMP or an ion beam etch and etching stops at the surface of the oxide layer 20. That is, the portions of the layer of conductive material 40 and the layer of dielectric material 30 that are deposited on top of the oxide layer 20 are etched away. The remaining portions of the layer of conductive material 40 and the layer of dielectric material 30 are those deposited in the openings 25a and 25b of the oxide layer 20.

FIG. 7 illustrates a fabrication process performed on the semiconductor-based device 10 of FIG. 6 according to one embodiment. The oxide layer 20 is removed. In one embodiment, the oxide layer 20 is oxide etched away by hydrogen fluoride (HF). This process leaves behind a fence-like structure or the insulation fence 50, which is formed by the remaining dielectric material 30 and conductive material 40 that were deposited in the openings 25a and 25b of the oxide layer 20. In one embodiment, the hydrogen fluoride etch is used to release the MEMS device 16.

Figure 8:
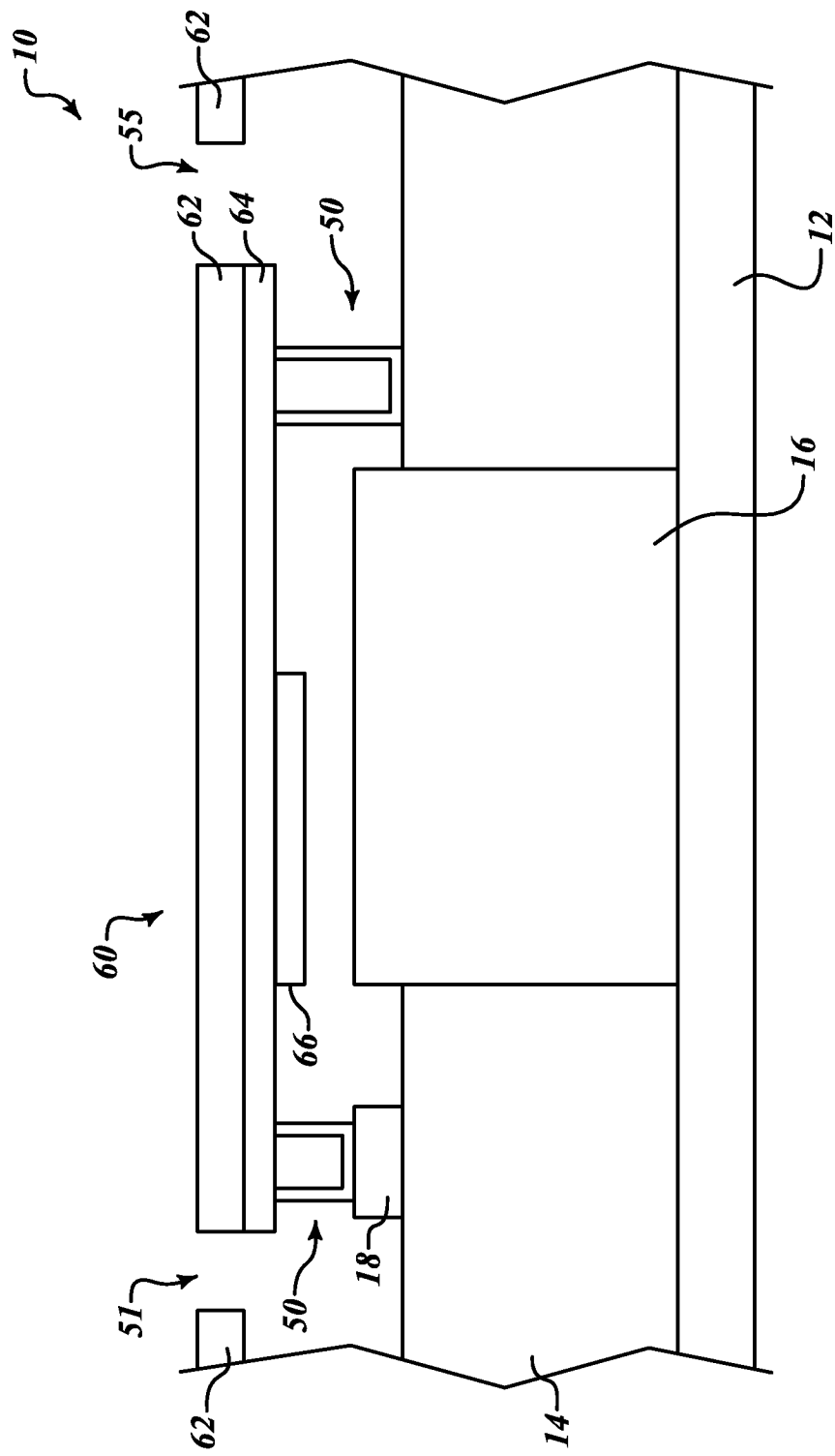

FIG. 8 illustrates a fabrication process performed on the semiconductor-based device 10 of FIG. 7 according to one embodiment. It is taken generally along line 8-8 of FIG. 9. A lid 60 is attached to the insulation fence 50 to provide packaging for the MEMS device 16. In one embodiment, the lid 60 includes a layer of dielectric material 62 and a layer of bonding material 64.

In one embodiment, the lid of dielectric material 62 is a portion of an undoped silicon wafer and the layer of bonding material 64 is a layer of glass frit. In other embodiments, the lid 60 is a glass, quartz, silicon carbide or some other airtight protective layer. In another embodiment, the layer of bonding material 64 includes a layer of eutectic material, such as gold for example. In yet another embodiment, the layer of bonding material 64 includes a layer of polycrystalline silicon. In other embodiments, the layer of bonding material 64 includes a material that is conducive to the bonding between the lid 60 and the insulation fence 50.

The lid 60 may also include a getter material 66, which includes a reactive material to remove traces of gas and impurities from the MEMS 16 to help maintain a vacuum.

In one embodiment, the space enclosed by the lid 60, the insulation fence 50 and the semiconductor-based device 10, which includes the MEMS device 16, the semiconductor structure 14 and the structure 18, is vacuum sealed. A vacuum seal such as the one disclosed herein may ensure a high vacuum over the life of the device. In other embodiments, a hermetic seal is formed by bond 64 to prevent an exchange of gasses, but there is no vacuum in the MEMS 16. It may contain argon, ambient air or some other gas at standard atmospheric pressure.

In one embodiment, the lid 60 includes one or more openings. Only two openings 51 and 55 are shown in FIG. 8 for simplicity. The location of the openings 51 and 55 are chosen so that the openings 51 and 55 are aligned for a deep contact to be disposed after the lid wafer 60 is bonded to the insulation fence 50. In embodiments where there are more than one locations where contact with semiconductor structure 14 is desired, there may be multiple openings. Each opening 51 and 55 in the lid wafer 60 allows access to semiconductor structure 14, such as by a bonding wire, or deep contact, for example. In one embodiment, the lid wafer 60 is etched using tetramethylammonium hydroxide (TMAH) to create the openings 51 and 55. In one embodiment, the openings 51 and 55 are created after the lid wafer 60 is bonded to the insulation fence 50. In another embodiment, the openings 51 and 55 are partially created before the lid wafer 60 is bonded to the insulation fence 50, and the lid wafer 60 is lapped back to fully expose the openings 51 and 55 after bonding. In one embodiment, the lid wafer 60 enables a generic process to be used to interface to a device created by micromachining.

Figure 9:
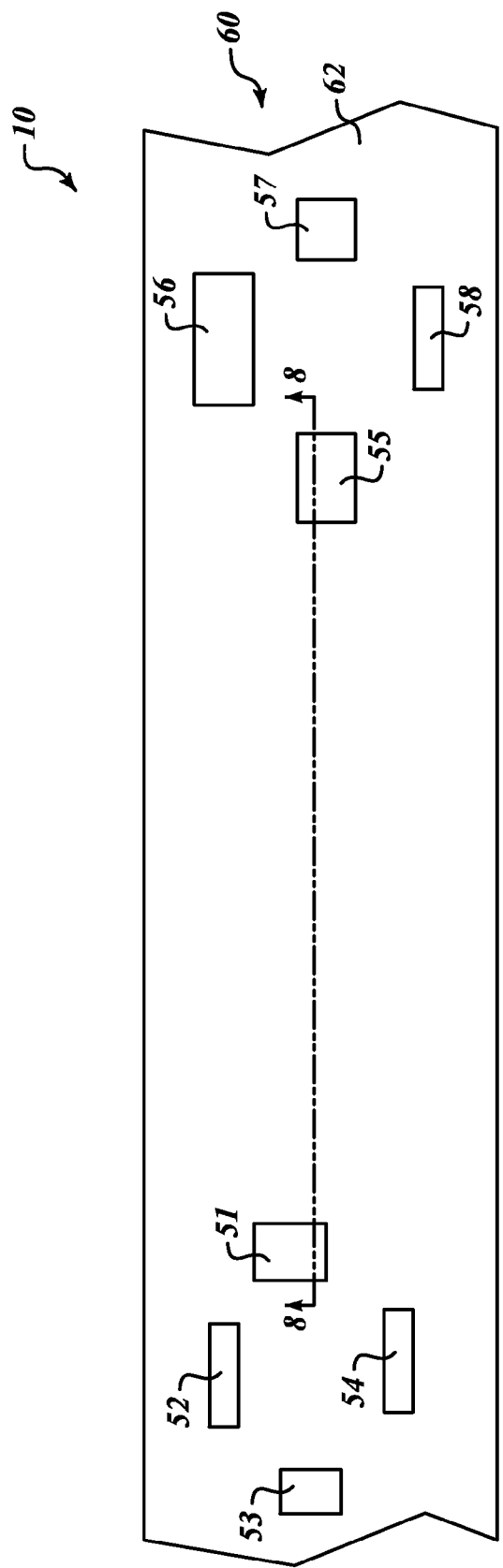
FIG. 9 is a simplified schematic of a top level view of the semiconductor-based device on a wafer level after the fabrication process of FIGS. 2-8 according to one embodiment of the invention.

FIG. 9 is a simplified diagram of a top level view of the semiconductor-based device 10 on a wafer level after the fabrication process of FIGS. 2-8 according to one embodiment. As shown in FIG. 9, in one embodiment, the lid 60 includes a number of openings 51, 52, 53, 54, 55, 56, 57, and 58 to allow access to areas of interest on semiconductor structure 14 of the semiconductor-based device 10.

Figure 10:
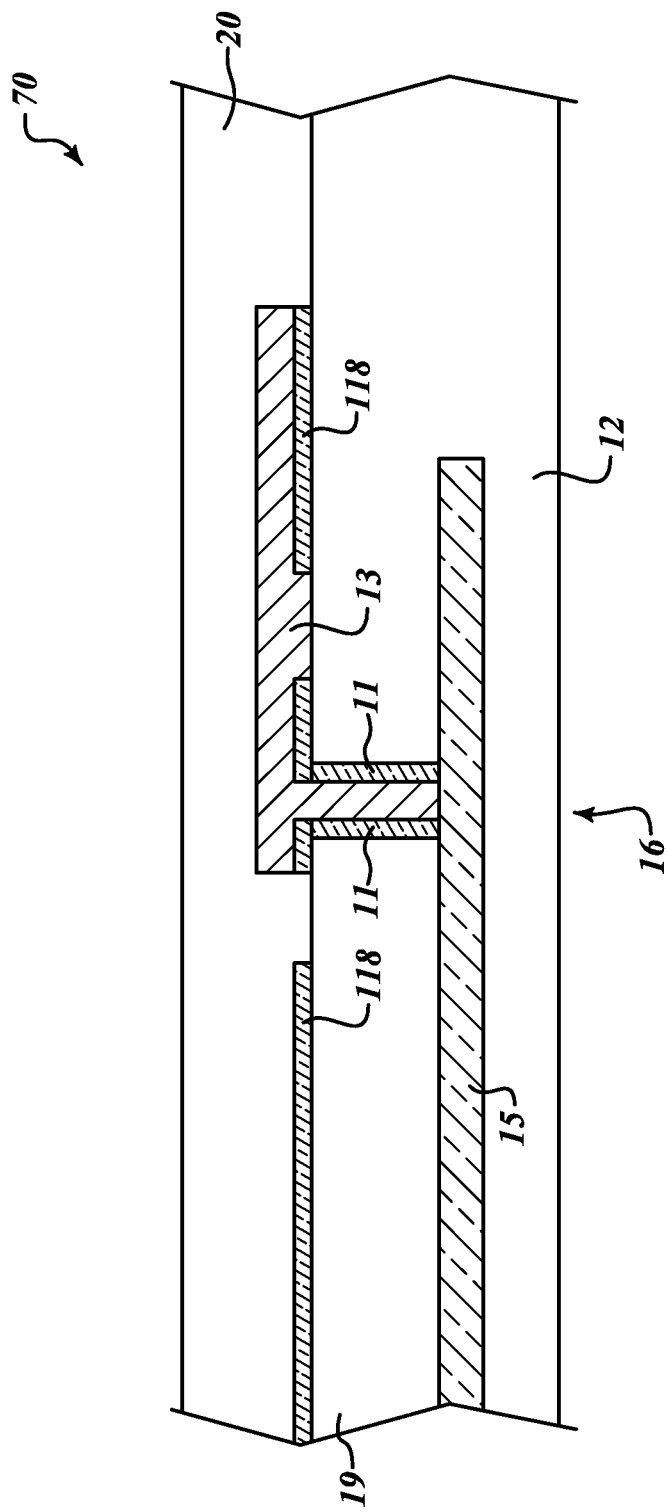
FIGS. 10-14 are simplified schematics progressively showing a fabrication process performed to package an example of a MEMS device.

FIG. 10 illustrates an example of a MEMS device 16 that may be constructed in a semiconductor-based device 70, according to one embodiment of the invention. MEMS device 16 includes an oxide 11, an electrode 13, a buried oxide 15, an oxide layer 118, and an electrode 19. In this embodiment, MEMS device 16 is a silicon resonator. Silicon resonators offer advantages over quartz resonators such as small size, greater robustness, and better aging performance.

FIG. 10 also illustrates a fabrication process performed on the semiconductor-based device 70 according to one embodiment. An oxide layer 20 is formed on the MEMS device 16. In other embodiment, the oxide layer 20 is a layer of tetraethyl orthosilicate (TEOS) deposited on the MEMS device 16. In other embodiments, the oxide layer 20 is a layer of undoped silicate glass (USG) deposited on the MEMS device 16 or a buried oxide made by ion implantation of oxygen atoms through the substrate 12. The oxide layer 20 is planarized after deposition. In one embodiment, the oxide layer 20 is planarized by chemical-mechanical polishing (CMP).

Figure 11:
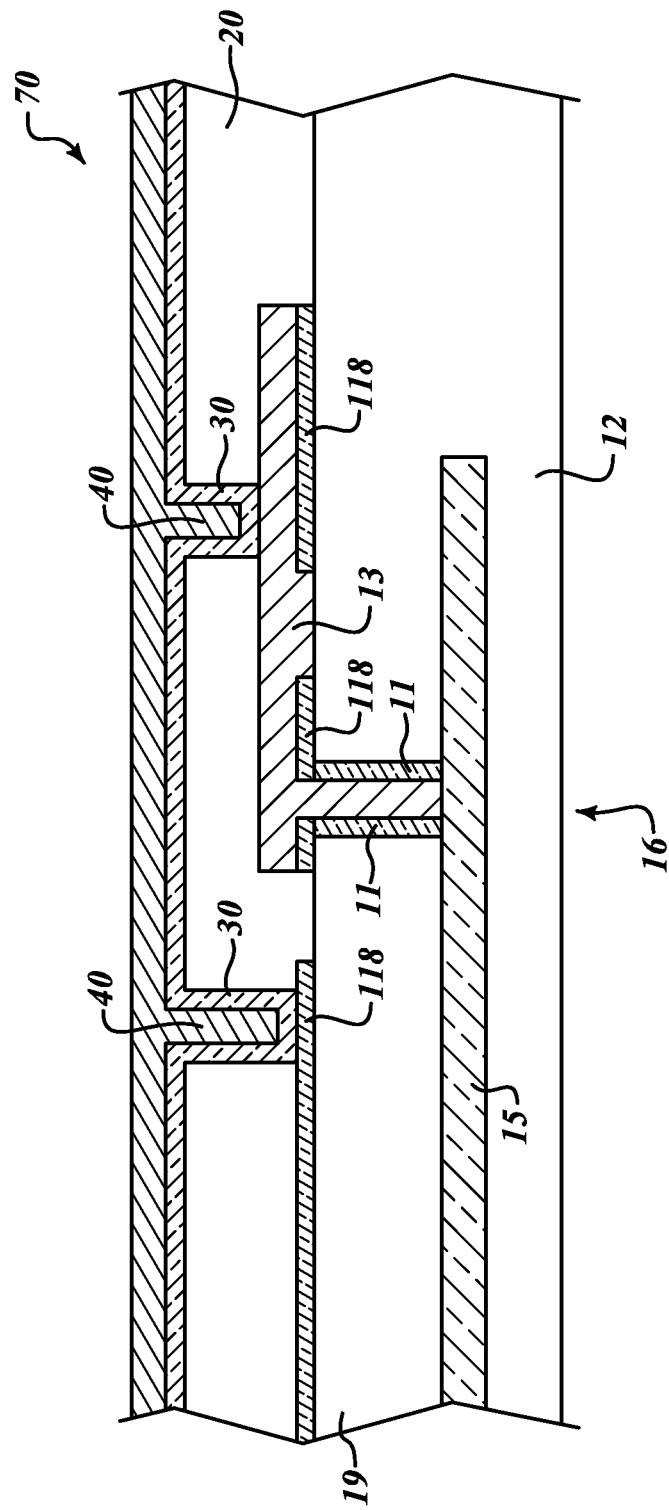

FIG. 11 illustrates a fabrication process performed on the semiconductor-based device 70 of FIG. 10 according to one embodiment. A layer of dielectric material 30 is formed on the oxide layer 20 and MEMS device 16, and a layer of conductive material 40 is formed on the layer of dielectric material 30. The dielectric material 30 and conductive material 40 fill openings formed within the oxide layer 20.

In one embodiment, the layer of dielectric material 30 is a layer of nitride deposited on the oxide layer 20 and the MEMS device 16. Examples of nitrides that are insulators include silicon nitride and boron nitride. In one embodiment, the layer of dielectric material 30 is a layer of silicon nitride deposited on the oxide layer 20 and in the openings of the oxide layer 20. The dielectric layer 30 prevents the fence from conducting current between structures of the semiconductor-based device 70. In one embodiment, the thickness of the layer of dielectric material 30 is approximately 0.5 μm.

In one embodiment, the layer of conductive material 40 is a layer of polycrystalline silicon deposited on the layer of dielectric material 30. In another embodiment, the layer of conductive material 40 is a layer of epitaxially-grown monocrystalline silicon. In yet another embodiment, the layer of conductive material 40 is a layer of metallic material. Because bonding with dielectric material is relatively more difficult, the use of polycrystalline silicon, metal, or epitaxially-grown monocrystalline silicon as a component of the insulation fence 50 will promote bonding between the insulation fence 50 and the lid 60. In one embodiment, the thickness of the layer of conductive material 40 deposited on top of the layer of dielectric material 30 is approximately between 10 and 20 μm. In one alternative embodiment, the material 40 is a dielectric, such as an oxide or a nitride.

Figure 12:
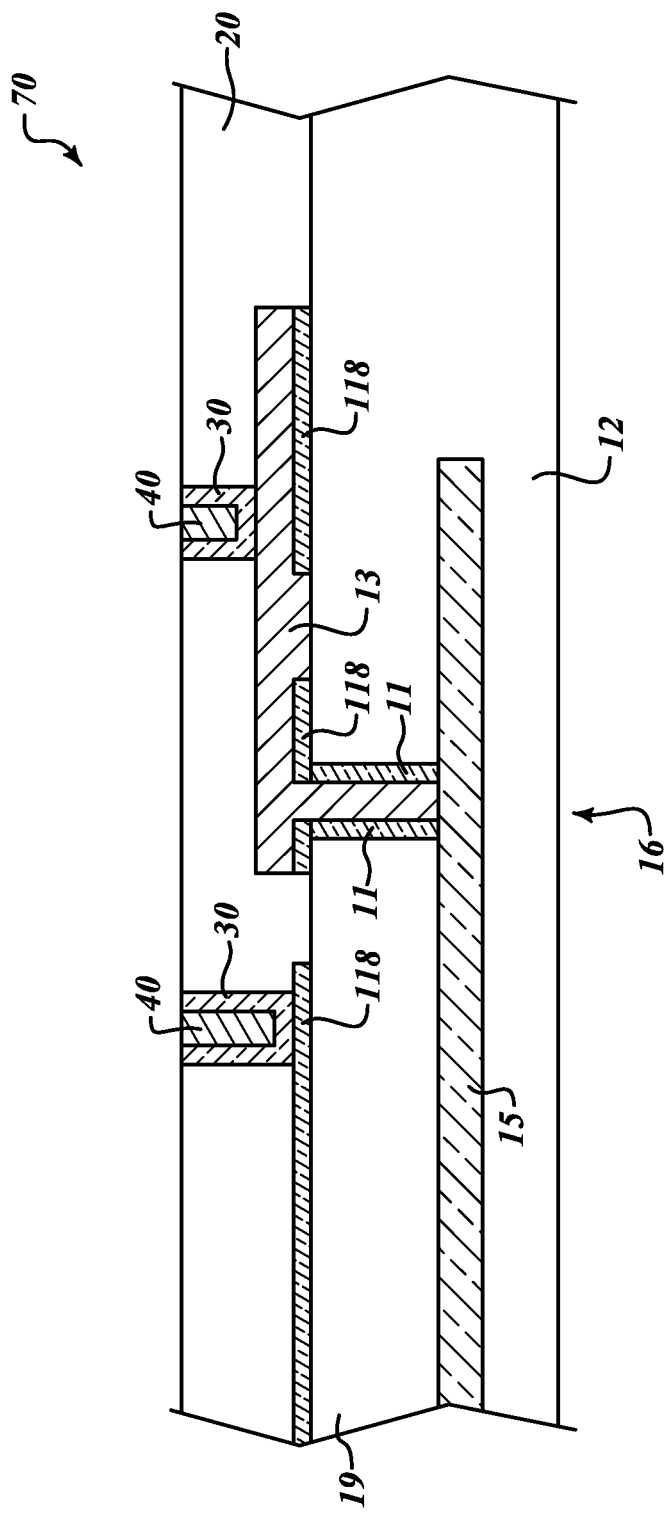

FIG. 12 illustrates a fabrication process performed on the semiconductor-based device 70 of FIG. 11 according to one embodiment. The portions of the layer of conductive material 40 and the layer of dielectric material 30 that are deposited on top of the oxide layer 20 are removed. In one embodiment, the layer of conductive material 40 and the layer of dielectric material 30 are etched back by CMP or an ion beam etch and etching stops at the surface of the oxide layer 20.

Figure 13:
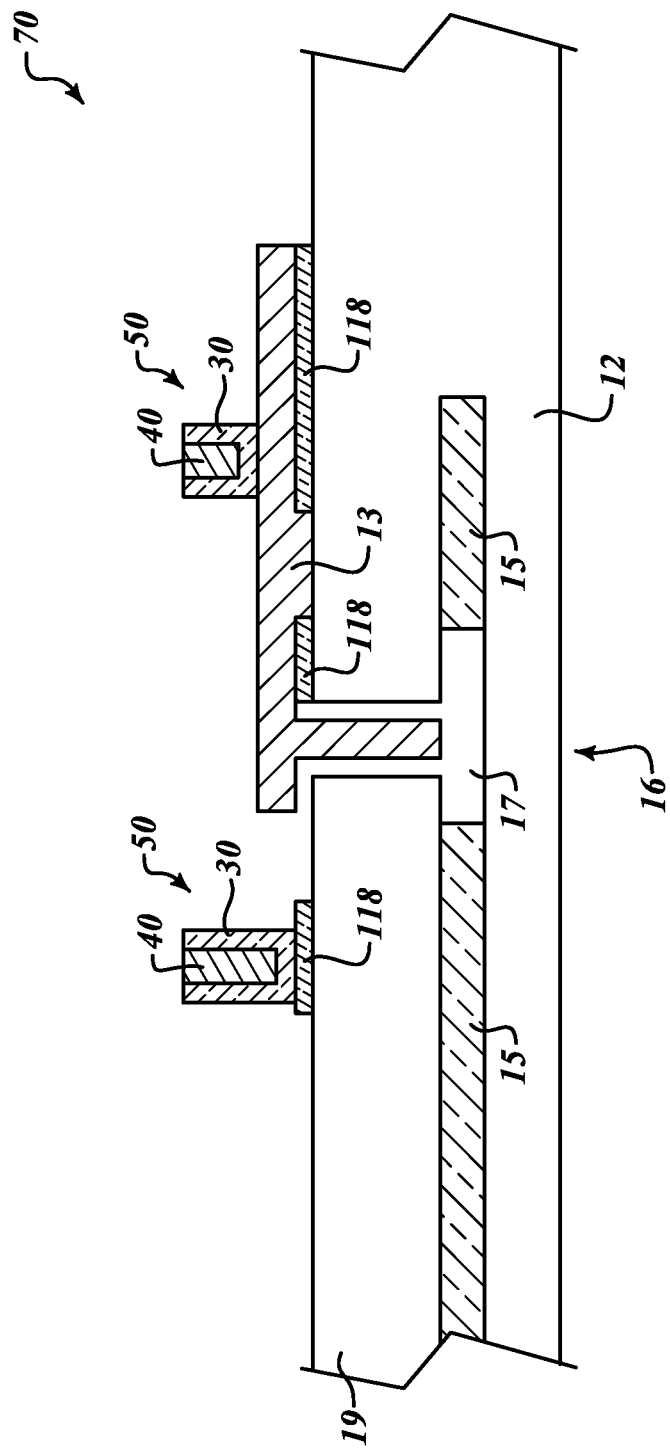

FIG. 13 illustrates a fabrication process performed on the semiconductor-based device 70 of FIG. 12 according to one embodiment. The oxide layer 20 is removed as is a portion of oxide layer 118. In one embodiment, the oxide layer 20 is oxide etched away by hydrogen fluoride (HF). This process leaves behind a fence-like structure or the insulation fence 50, which is formed by the remaining dielectric material 30 and conductive material. In one embodiment, the hydrogen fluoride etch is used to release the MEMS device 16 by etching away oxide 11, part of buried oxide 15, and part of oxide layer 118 to create MEMS space 17.

Figure 14:
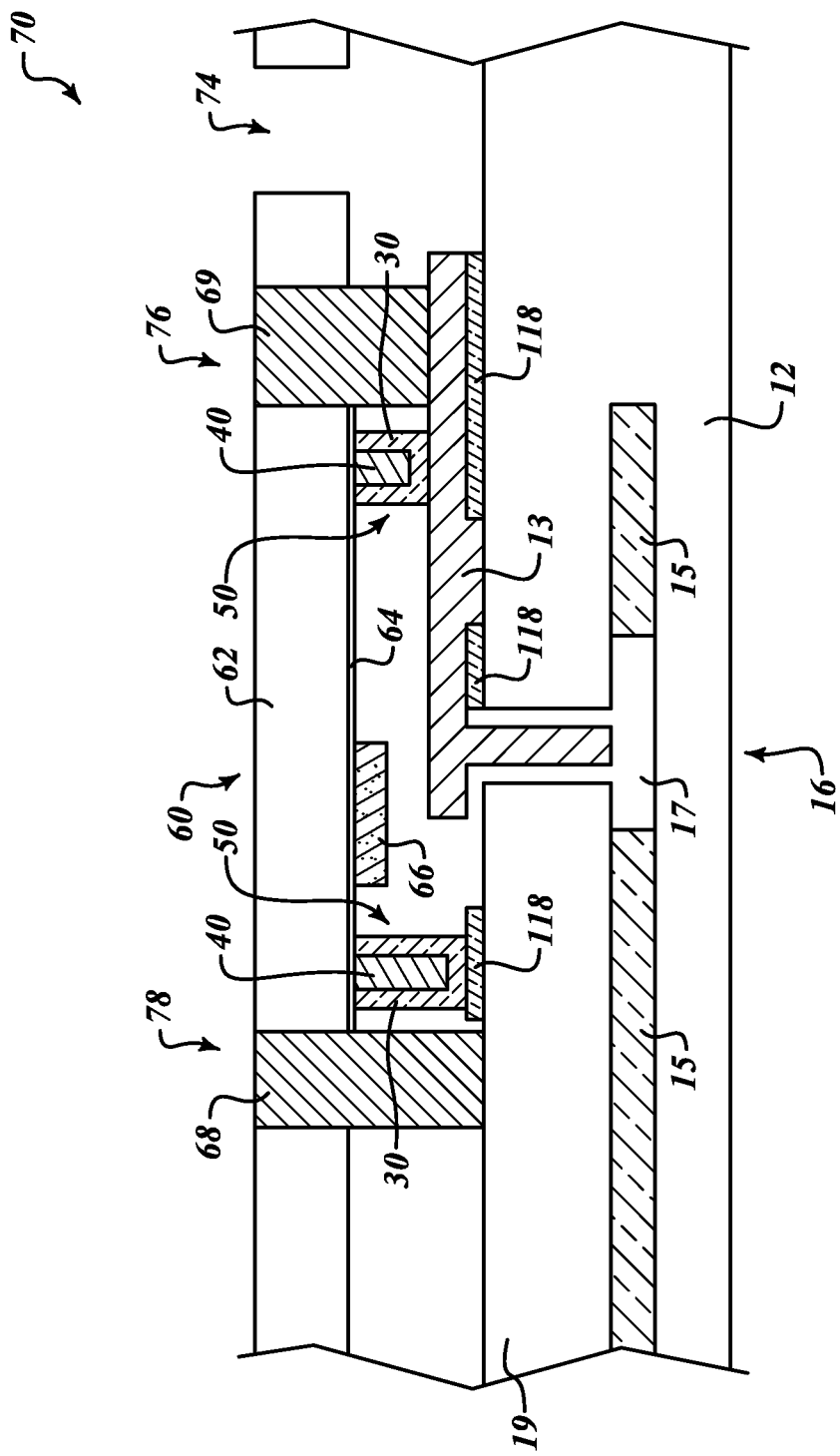

FIG. 14 illustrates further steps in the fabrication process performed on the semiconductor-based device 70 of FIG. 13 according to one embodiment. It is taken generally along line 14-14 of FIG. 15. A lid 60 is attached to the insulation fence 50 to provide packaging for the MEMS device 16. The lid 60 is formed and attached using the same techniques as previously described with respect to FIGS. 7 and 8. The lid 60 may also include a getter material 66, which includes a reactive material to remove traces of gas and impurities from the MEMS 16 to help maintain a vacuum. In one embodiment, the space enclosed by the lid 60, the insulation fence 50 and the MEMS device 16 is vacuum sealed. In one embodiment, a hermetic seal is formed by bond 64 to prevent an exchange of gasses, but there is no vacuum in the MEMS 16.

In one embodiment, the lid 60 includes one or more openings, such as openings 74, 76, and 78. The locations of the openings 74, 76, and 78 are chosen so that the openings 74, 76, and 78 are aligned for deep contacts 68 and 69 to be disposed after the lid wafer 60 is bonded to the insulation fence 50. As shown, deep contact 68 makes contact with electrode 19, and deep contact 69 makes contact with electrode 13. The openings 74, 76, and 78 enable electrical contact with the MEMS device 16 from above the lid wafer 60.

Conventional prior art lid approaches use contacts disposed well outside the device area in order to maintain an air tight seal on the MEMS device, therefore the embodiments of the present disclosure manifest the ability to build MEMS devices in less area, thereby increasing the number of die per wafer.

In one embodiment, additional integrated circuits are constructed above lid wafer 60, and the additional circuits utilize the deep contacts 68 and 69 to provide signals to and receive signals from the MEMS device 16. In this embodiment, the lid 60 is a fully functional semiconductor silicon wafer having integrated circuits formed thereon. A group of CMOS logic circuits having full transistors with sources, drains and channel regions are formed in the upper side of the lid wafer 60. One surface of the lid wafer may therefore be an active surface with integrated circuits formed therein. The lid wafer 60 in this embodiment performs two functions: an air tight seal as a lid to the MEMS and a semiconductor substrate for active transistors.

In one embodiment, the openings 74, 76, and 78 are partially created before the lid wafer 60 is bonded to the insulation fence 50, and the lid wafer 60 is lapped back to fully expose the openings 74, 76, and 78 after bonding. In this embodiment, the active surface of the lid wafer may be the downward facing side, in the regions near the through hole 74 and the other side of the MEMS.

Figure 15:
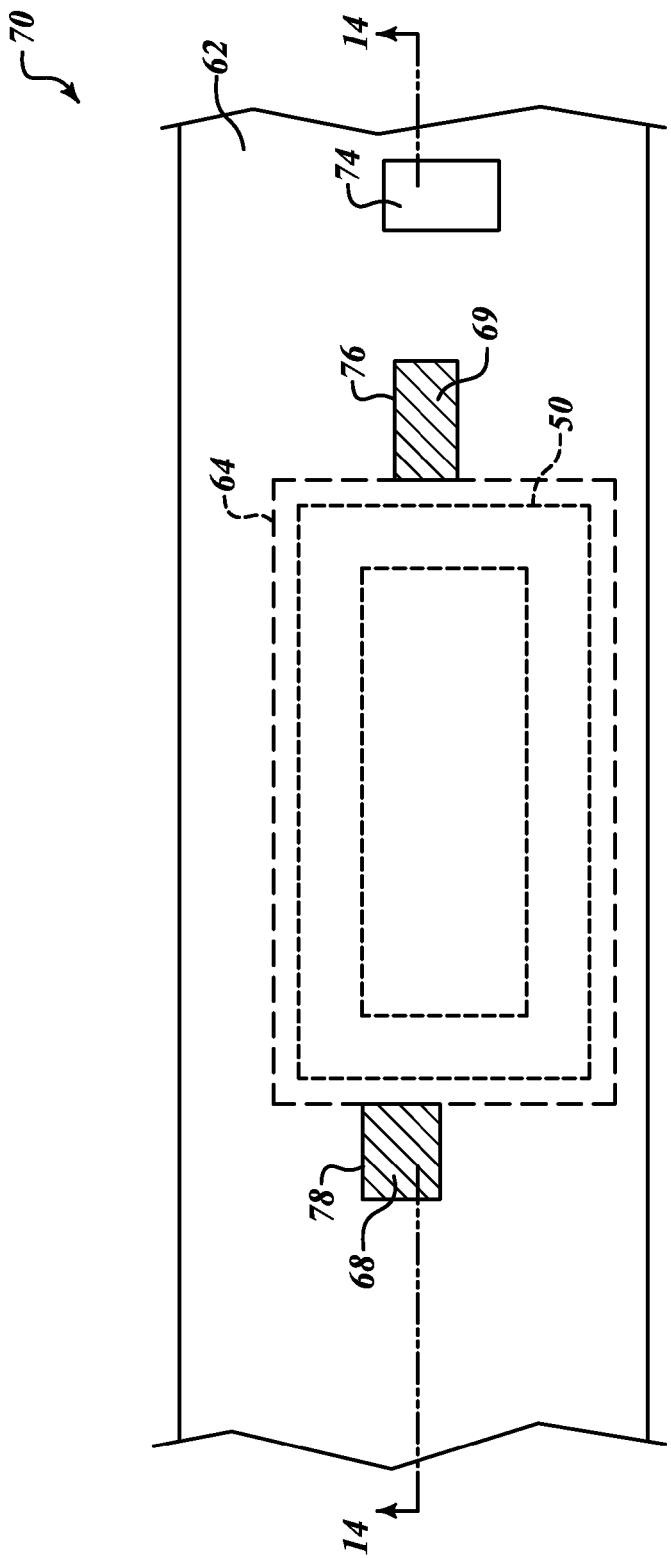
FIG. 15 is a simplified schematic of a top level view of the semiconductor-based device of FIG. 14 after the fabrication process of FIGS. 10-14 according to one embodiment of the invention.

FIG. 15 is a simplified diagram of a top level view of the semiconductor-based device 70 after the fabrication process of FIGS. 10-14 according to one embodiment. As shown in FIG. 14, in one embodiment, the lid 60 includes a number of openings 74, 76, and 78 to allow access to areas of interest on MEMS device 16 of the semiconductor-based device 70.

Thus, a fabrication process for packaging MEMS devices, such as the MEMS device 16, is disclosed. It is believed that the process will ensure high integrity of vacuum seal over the life time of the MEMS device 16. The use of dielectrics in building the insulation fence 50 should ensure electrical contacts and the lid wafer 60 are isolated. Unlike prior art fabrication processes, packaging for MEMS devices built by embodiments of the disclosed fabrication process should require less area, thereby preserving die area for other use. Furthermore, the disclosed fabrication process, and the various embodiments thereof, is believed to be a generic process that can be adopted flexibly and easily for a wide range of MEMS devices fabricated by micromachining technology.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other context, not necessarily the exemplary context of completely sealing a MEMS device with an insulation fence and a lid wafer generally described above. For example, if a part of the MEMS device 16 is to be exposed and not sealed by the insulation fence 50 and the lid wafer 60, the locations of the openings 25a and 25b in the oxide layer 20 can be chosen so that the resultant insulation fence 50 leaves the particular part of the MEMS device 16 exposed.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
    a substrate;
    electronic components in the substrate;
    a sensor configured to interact with the electronic components in the substrate;
    an enclosure positioned on the substrate, the enclosure including:
        an exterior dielectric layer having a first portion, a second portion, and a third portion that couples the first portion to the second portion; and
        an interior conductive layer within the exterior dielectric layer, the interior conductive layer being on the third portion and between the first portion and the second portion; and
    a cover positioned on the enclosure, the cover configured to contact the first portion and the second portion of the exterior dielectric layer and the interior conductive layer to seal the sensor within the enclosure.

2. The device of claim 1 wherein in cross-section the exterior dielectric layer is U-shaped and the first portion is substantially parallel to the second portion of the exterior dielectric layer.

3. The device of claim 1 wherein a top surface of the enclosure includes a top surface of the interior conductive layer between a top surface of the first portion and a top surface of the second portion of the exterior dielectric layer.

4. The device of claim 1 wherein a bottom surface of the enclosure includes only the third portion of the exterior dielectric layer.

5. The device of claim 1 wherein a height between a top surface and a bottom surface of the enclosure has different dimensions at locations around the sensor.

6. The device of claim 1 wherein a height of the enclosure between the substrate and the cover have different dimensions at locations around the sensor.

7. The device of claim 1 wherein a portion of the sensor is above the substrate and the cover is above the substrate and above the portion of the sensor.

8. A method, comprising:
 forming electronic components in a substrate;
 forming a sensor configured to interact with the electronic components in the substrate;
 forming an enclosure on the substrate, the enclosure including an exterior dielectric layer and an interior conductive layer, the forming of the enclosure including:
  forming an opening in a sacrificial layer;
  forming the exterior dielectric layer in the opening, the exterior dielectric layer lining sidewalls of the opening; and
  forming the interior conductive layer on the exterior dielectric layer in the opening; and
 forming a cover on the enclosure, the cover configured to contact the exterior dielectric layer and the interior conductive layer and to seal the sensor within the enclosure.

9. The method of claim 8 wherein forming the sensor occurs before forming the enclosure.

10. The method of claim 9 where forming the enclosure includes:
 forming a planar top surface by removing portions of the exterior dielectric layer and the interior conductive layer, the top surface including the interior conductive layer between a first part of the exterior layer and a second part of the exterior layer.

11. The method of claim 8 wherein the sensor is a microelectromechanical device.

12. The method of claim 8 wherein the sensor includes a first conductive material and the interior conductive layer is a second conductive material that is different from the first conductive material.

13. The device of claim 1 wherein the enclosure has a top surface, a bottom surface, a first side surface, and a second side surface, the top surface includes a first portion of the exterior dielectric layer separated from a second portion of the exterior dielectric layer by the interior conductive layer, the bottom surface including only the exterior dielectric layer, the first side surface including only the exterior dielectric layer, and the second side surface including only the exterior dielectric layer.

14. The device of claim 1 wherein the exterior dielectric layer completely surrounds the interior conductive layer, except for on a top surface of the enclosure.

15. The device of claim 14 wherein the top surface of the enclosure includes a first portion of the exterior dielectric layer separated from a second portion of the exterior dielectric layer by the interior conductive layer.

* * * * *